(12) United States Patent
van Aerle et al.

(10) Patent No.: US 8,766,244 B2
(45) Date of Patent: Jul. 1, 2014

(54) PIXEL CONTROL STRUCTURE, ARRAY, BACKPLANE, DISPLAY, AND METHOD OF MANUFACTURING

(75) Inventors: Nick A. J. M. van Aerle, Eindhoven (NL); Erik van Veenendaal, Eindhoven (NL); Pieter van Lieshout, Eindhoven (NL); Christoph Wilhelm Sele, Eindhoven (NL); Joris P. V. Maas, Eindhoven (NL)

(73) Assignee: Creator Technology B.V., Breda (NL)

( * ) Notice: Subject to any disclaimer, the term of this patent is extended or adjusted under 35 U.S.C. 154(b) by 188 days.

(21) Appl. No.: 13/559,914

(22) Filed: Jul. 27, 2012
(Under 37 CFR 1.47)

(65) Prior Publication Data
US 2014/0027717 A1    Jan. 30, 2014

(51) Int. Cl.
*H01L 35/24*    (2006.01)
(52) U.S. Cl.
USPC ...................................... 257/40; 257/E51.001

(58) Field of Classification Search
USPC ............................................. 257/40, E51.001
See application file for complete search history.

(56) References Cited

U.S. PATENT DOCUMENTS

2008/0012012 A1*    1/2008    Hara ............................... 257/40

\* cited by examiner

*Primary Examiner* — Anthony Ho

(57) ABSTRACT

Pixel control structure for use in a backplane for an electronic display, including a transistor that has a gate, a source, a drain, and an organic semiconductor element. The pixel control structure is formed by a first patterned conductive layer portion, a second patterned conductive layer portion, a dielectric layer portion, and an organic patterned semiconductive layer portion. The dielectric layer portion comprises an overlap region defined by overlap of the second conductive layer portion over the first conductive layer portion. The overlap region defines an overlap boundary, defined by an edge portion of the first patterned conductive layer portion and an edge portion of the second patterned conductive layer portion. The patterned semiconductive layer portion extends over the overlap region and away from the overlap region so as to extend from both first and second edge portions.

22 Claims, 7 Drawing Sheets

PIXEL CONTROL STRUCTURE, ARRAY, BACKPLANE, DISPLAY, AND METHOD OF MANUFACTURING

TECHNICAL FIELD

The invention relates to a pixel control structure for use in a backplane for an electronic display, the control structure comprising a transistor that has a gate, a source, a drain, and an organic semiconductor element that is electrically connected to the source and the drain, the pixel control structure being formed by a first patterned conductive layer portion that comprises the gate, a second patterned conductive layer portion that comprises the source and the drain, a dielectric layer portion for separating the first and second patterned conductive layer portion, and an organic patterned semiconductive layer portion that comprises the semiconductor element of the transistor. The invention also relates to an array of the pixel control structures. The invention also relates to a backplane for an electronic display comprising an array according to the invention, in particular a flexible and optionally rollable and/or foldable backplane. The invention also relates to an electronic display provided with a backplane according to the invention, in particular a flexible and optionally rollable and/or foldable display. The invention further relates to a method of manufacturing a pixel control structure.

BACKGROUND

Known displays are usually rigid so as to form an inflexible display. In recent years, a wish for non-rigid, i.e. flexible, displays has risen. Such displays enable new ways of applying displays. Up till now however, it has proved to be a challenging task to manufacture flexible displays that have desired mechanical properties with respect to their flexibility, and at the same time show quality and reliability that customers expect from a display.

A promising method for manufacturing flexible displays involves the use of organic semiconductive materials. These materials may combine desirable semiconductive properties with desirable flexibility. During manufacturing, usually a dielectric layer is arranged in between a first and a second patterned conductive layer portion for separating the first and second patterned conductive layer portions. Then, a patterned semiconductive layer portion is often provided, at least partly, on top of the second patterned conductive layer portion.

Usually, semiconductive materials are deposited as a blanket and are patterned afterwards. Such patterning may involve covering the blanket of semiconductive layer with a resist pattern, followed by an etching step. However, during etching, in particular during the last stage of the etching which may require over-etching, the second patterned conductive layer portion and the dielectric layer portion are often also exposed to the etching. As a result, the second patterned conductive layer portion and the dielectric layer portion may be partly removed as a result of the etching. Manufacturing of pixel control structures has shown that such removal may deteriorate reliability of the pixel control structures. Especially for flexible displays, where achieving reliability is often more difficult because of the desired flexibility, such deterioration may be significant.

SUMMARY

It is an object of the invention to provide an improved pixel control structure having improved reliability. Further objects of the invention may involve providing an improved array of the pixel control structures, providing an improved backplane comprising the array of pixel control structures, and/or providing an improved display provided with the array of the pixel control structures. It is another object of the invention to provide an improved method of manufacturing the pixel control structure.

According to an aspect of the invention, there is provided a pixel control structure for use in a backplane for an electronic display, the control structure comprising a transistor that has a gate, a source, a drain, and an organic semiconductor element that is electrically connected to the source and the drain, the pixel control structure being formed by a first patterned conductive layer portion that comprises the gate, a second patterned conductive layer portion that comprises the source and the drain, a dielectric layer portion for separating the first and second conductive layer portion, and an organic patterned semiconductive layer portion that comprises the semiconductor element of the transistor, wherein the first patterned conductive layer portion and the second patterned conductive layer portion respectively have a first edge portion and a second edge portion, said first and second edge portion determining an overlap region wherein the second patterned conductive layer portion overlaps the first patterned conductive layer portion, and the overlap region is bounded along the first edge portion and is bounded along the second edge portion, wherein the patterned semiconductive layer portion extends over the overlap region and away from the overlap region so as to extend from both first and second edge portions.

According to another aspect of the invention, there is provided a method of manufacturing a pixel control structure in a backplane, wherein the pixel control structure comprises a transistor that has a gate, a source, a drain, and an organic semiconductor element that is electrically connected to the source and the drain, the method comprising forming the pixel control structure by providing a first patterned conductive layer portion that comprises the gate, a second patterned conductive layer portion that comprises the source and the drain, a dielectric layer portion for separating the first and second patterned conductive layer portion, and an organic patterned semiconductive layer portion that comprises the semiconductor element of the transistor, wherein the first patterned conductive layer portion and the second patterned conductive layer portion respectively have a first edge portion and a second edge portion, said first and second edge portions determining an overlap region wherein the second patterned conductive layer portion overlaps the first patterned conductive layer portion, and the overlap region is bounded along the first edge and second edge portions, wherein the patterned semiconductive layer portion extends over the overlap region and away from the overlap region, so as to extend from both first and second edge portions to thereby shield the second edge portion. Said method may be used for manufacturing the pixel control structure according to said aspect of the invention.

According to said aspect and said further aspect, the patterned semiconductive layer portion extends over the overlap region and away from the overlap region so as to extend from the second edge portion, to thereby shield the second edge portion. Hence, the patterned semiconductive layer portion may extend over the overlap region and away from the overlap region to cover, at least partly and preferably substantially completely, the second edge portion. Thus, a patterned resist layer portion that may be arranged on top of the patterned semiconductive layer portion during an etching step of patterning to obtain the patterned semiconductive layer portion, may extend over the overlap region and away from the overlap region to cover, at least partly and preferably substantially completely, the second edge portion. By means of said patterned resist layer portion, deterioration of the dielectric layer portion at or adjacent to the second edge portion may, at least partly, be prevented.

The inventors recognized that a decreased break-down voltage between the first and second patterned conductive layer portion at or adjacent to the overlap boundary could be caused by said deterioration. Thus, in use, a higher probability of breakdown may result from the deterioration. Hence, according to said aspect and said further aspect, a probability for electrical break-down may be reduced. A reliability of the pixel control structure may be improved. E.g., a yield can be improved and/or an operational life-time can be improved. Additionally, such advantages may be achieved without additional processing steps. Hence, additional costs for achieving the reduced probability for electrical break-down may be substantially prevented.

Preferably, the patterned semiconductive layer portion extends over the overlap region and away from the overlap region so as to extend from substantially all of the first and second edge portions. Preferably, the patterned semiconductive layer portion extends over the overlap region and away from the overlap region to cover, substantially completely, the first edge portion and/or the second edge portion. Optionally, the patterned semiconductive layer portion extends over substantially the whole overlap region. Preferably, the first boundary part and the second boundary part together form substantially the whole overlap boundary. Thus, substantially all of the overlap region is bounded along the first edge portion or along the second edge portion.

The dielectric layer portion may comprise an organic and/or an inorganic material. The invention is especially useful for manufacturing a display control structure having a dielectric layer portion that comprise an organic material. Such an organic dielectric layer portion may be more vulnerable to deterioration as a result of the etching.

In an embodiment, the patterned semiconductive layer portion has, by extending away from the overlap region to extend over the first edge portion, an overlay part of the patterned semiconductive layer portion that is, in use, substantially free of electrical control by the first conductive layer portion. Surprisingly, providing such an uncontrolled part of the semiconductive layer by designing the patterned resist layer may be beneficial for overlap with the second edge portion, in particular for reliability of the overlap with the second edge portion. A part of the patterned resist layer portion that is provided on top of said uncontrolled part of the semiconductive layer portion, may provide said overlap with the first edge portion. Preferably, the part of the patterned semiconductive layer portion that is, in use, substantially free of electrical control by the first patterned conductive layer portion lacks a direct electrical path from the source to the drain. In particular, preferably, all electrical pathways in the semiconductor layer portion are controlled by the first patterned conductive layer.

In an embodiment, the dielectric overlap region is, at least partly, formed in a transistor region, wherein at least part of the gate is overlapped and extends at least partly under the source and the drain, the transistor region being bounded along a first transistor edge portion that forms at least part of the first edge portion, and being bounded along a second transistor edge portion that forms at least part of the second edge portion, wherein the patterned semiconductive layer portion extends over the transistor region and away from the transistor region so as to extend from both first and second transistor edge portions. Hence, the patterned semiconductive layer portion may extend over the transistor region and away from the transistor region to cover, at least partly, the second transistor edge portion and to extend over, at least partly, the first transistor edge portion.

In an embodiment, the first patterned conductive layer portion forms a portion of a row line that extends through a plurality of pixel control structures, and wherein the second patterned conductive layer portion forms a portion of a source-drain column line that extends through a plurality of pixel control structures in a direction transverse to the row line so that, in the pixel control structure, the source-drain column line portion crosses over the row line portion, wherein the overlap region is, at least partly, formed by a cross-over region that overlaps the gate line portion and extends under the source-drain column line portion where the source-drain column line portion crosses over the row line portion, the cross-over region being bounded along a first cross-over edge portion that forms at least part of the first edge portion, and being bounded along a second cross-over edge portion that forms at least part of the second edge portion, wherein the patterned semiconductive layer portion extends over the cross-over region and away from the cross-over region so as to extend from both first and second cross-over edge portions. Hence, the patterned semiconductive layer portion may extend over the cross-over region and away from the cross-over region to cover, at least partly, the second cross-over edge portion and to extend over, at least partly, the first cross-over edge portion. The row line may e.g. be a gate row line or a storage capacitor row line. Hence, the cross-over region may be respectively a gate row line cross-over region or a capacitor row line cross-over region. The overlap region may comprise a plurality of cross-over regions. E.g., at least one of the cross-over regions may overlap a gate row line portion. E.g., another one of the cross-over regions may overlap a capacitor row line portion.

In an embodiment, the first patterned conductive layer portion forms a first electrode of the storage capacitor, and the second patterned conductive layer portion forms a second electrode of the storage capacitor that, at least partly, overlaps the first electrode, wherein the dielectric overlap region is, at least partly, formed in a capacitor region wherein the dielectric layer overlaps the first electrode and extends under the second electrode where the second electrode overlaps the first electrode, the capacitor region being bounded along a first capacitor edge portion that forms at least part of the first edge portion, and being bounded along a second capacitor edge portion that forms at least part of the second edge portion, wherein the patterned semiconductive layer portion extends over the capacitor region and away from the capacitor region so as to extend from both first and second capacitor edge portions. Hence, the patterned semiconductive layer portion may extend over the capacitor region and away from the capacitor region to cover, at least partly, the second capacitor edge portion and to extend over, at least partly, the first capacitor edge portion.

Thus, optionally, the overlap region comprises a transistor region, a cross-over region or a plurality of cross-over regions, and/or a capacitor region. Said plurality of cross-over regions may comprise the gate row line cross-over region and the capacitor row line cross-over region.

In an embodiment, the overlap region comprises a plurality of mutually separated regions that are overlapped at least partly by the patterned semiconductive layer portion. Optionally, each separated region may have a separated region boundary closed in itself. Optionally, the overlap boundary that bounds the overlap region comprises the separated region boundaries.

In an embodiment, on top of the patterned semiconductive layer portion, a patterned resist layer portion is provided for protecting the patterned semiconductive layer portion during an etching step. Thus, the patterned semiconductive layer portion may be patterned according to a similar pattern as the patterned resist layer portion is patterned.

Other aspects of the invention comprise: an array of the pixel control structures according to the invention, which array extends in two mutually transverse directions; a backplane for an electronic display comprising an array according to the invention; and an electronic display provided with a backplane according to the invention.

BRIEF DESCRIPTION OF THE DRAWINGS

The invention will now be illustrated, in a non-limiting way, with reference to the accompanying drawing, wherein.

DETAILED DESCRIPTION

Figure 1:
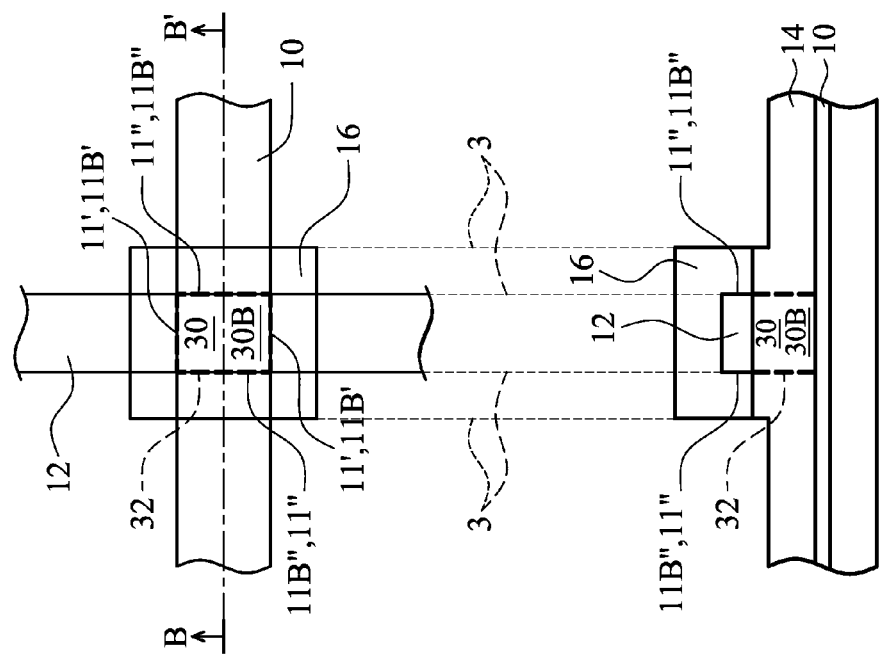
FIG. 1 schematically shows a part of a pixel control structure for use in a backplane for an electronic display, in a first embodiment according to the invention.

Unless stated otherwise, like reference numerals refer to like elements throughout the drawings.

FIG. 1 schematically shows a part of a pixel control structure for use in a backplane for an electronic display, in a first embodiment according to the invention. FIG. 1 shows, at the top of FIG. 1, a transparent top view of the part of the pixel control structure. FIG. 1 shows, at the bottom of FIG. 1 and associated with the top view by imaginary lines 3, a cross-section B-B' of the part of the pixel control structure. In FIG. 1, a part of the first patterned conductive layer portion is shown that forms a portion of a row line 10 that extends through a plurality of pixel control structures. Further, FIG. 1 shows a part of the second patterned conductive layer portion that forms a portion of a source-drain column line 12 that extends through a plurality of pixel control structures in a direction transverse to the row line. As a result, in the pixel control structure, the source-drain column line portion 12 crosses over the row line portion.

More generally, the pixel control structure is formed at least by a first patterned conductive layer portion 10, a second patterned conductive layer portion 12, a dielectric layer portion 14, and an organic patterned semiconductive layer portion 16. The first patterned conductive layer portion comprises the gate. The second patterned conductive layer portion comprises the source and the drain. The dielectric layer portion separates the first and second conductive layer portion. The organic patterned semiconductive layer portion comprises the semiconductor element of the transistor.

The first patterned conductive layer portion 10 and the second conductive layer portion 12 respectively have a first edge portion 11' and a second edge portion 11". The dielectric layer portion 14 comprises an overlap region 30 defined by overlap of the second conductive layer portion 12 over the first patterned conductive layer portion 10. Thus, the first and second edge portions determine the overlap region 30. The overlap region is bounded along, here parallel with, the first edge portion 11'. The overlap region is further bounded along, here parallel with, the second edge portion 11". Thus, a boundary 32 of the overlap region may extend along the first edge portion 11' and along the second edge portion 11". The patterned semiconductive layer portion 16 extends over the overlap region and away from the overlap region so as to extend from both the first edge portion and the second edge portion. Thus, the patterned semiconductive layer portion 16 extends over the overlap region 30 and away from the overlap region 30 to cover the second edge portion 11' and to extend over the first edge portion 11" to thereby shield the second edge portion. It is noted that coverage of the second edge portion is sufficient when the interface between the second edge portion and the dielectric layer is covered. In this way fringe fields generated near the edges of the second edge portion, in particular on sharp corners thereof, can be shielded between the first and second conductive layers, that could cause electrical break downs through the dielectric layer.

In the example of FIG. 1, the overlap region is, at least partly, formed by a cross-over region 30B. The cross-over region overlaps the gate line portion 10 and extends under the source-drain column line portion 12 where the source-drain column line portion crosses over the row line portion. The cross-over region may be bounded along a first cross-over edge portion 11B' that forms at least part of the first edge portion 11'. The cross-over region may be further bounded along a second cross-over edge portion 11B" that forms at least part of the second edge portion 11". In the embodiment of FIG. 1, the patterned semiconductive layer portion 16 overlaps the first cross-over edge portion 11B' and the second cross-over edge portion 11B" completely. The patterned semiconductive layer portion 16 may extend over the cross-over region 30B and away from the cross-over region to cover the second cross-over edge portion 11B" and to extend over the first cross-over edge portion 11B'.

The extending and overlapping patterned semiconductive layer portion may be obtained by a matching patterned resist layer portion, arranged on top of the patterned semiconductive layer portion during an etching step of patterning to obtain the patterned semiconductive layer portion. By means of said patterned resist layer portion, deterioration of the dielectric layer portion at or adjacent to the second edge portion may, at least partly, be prevented. Thus, a break-down voltage between the first and second conductive layer portion may be increased.

Figure 2:
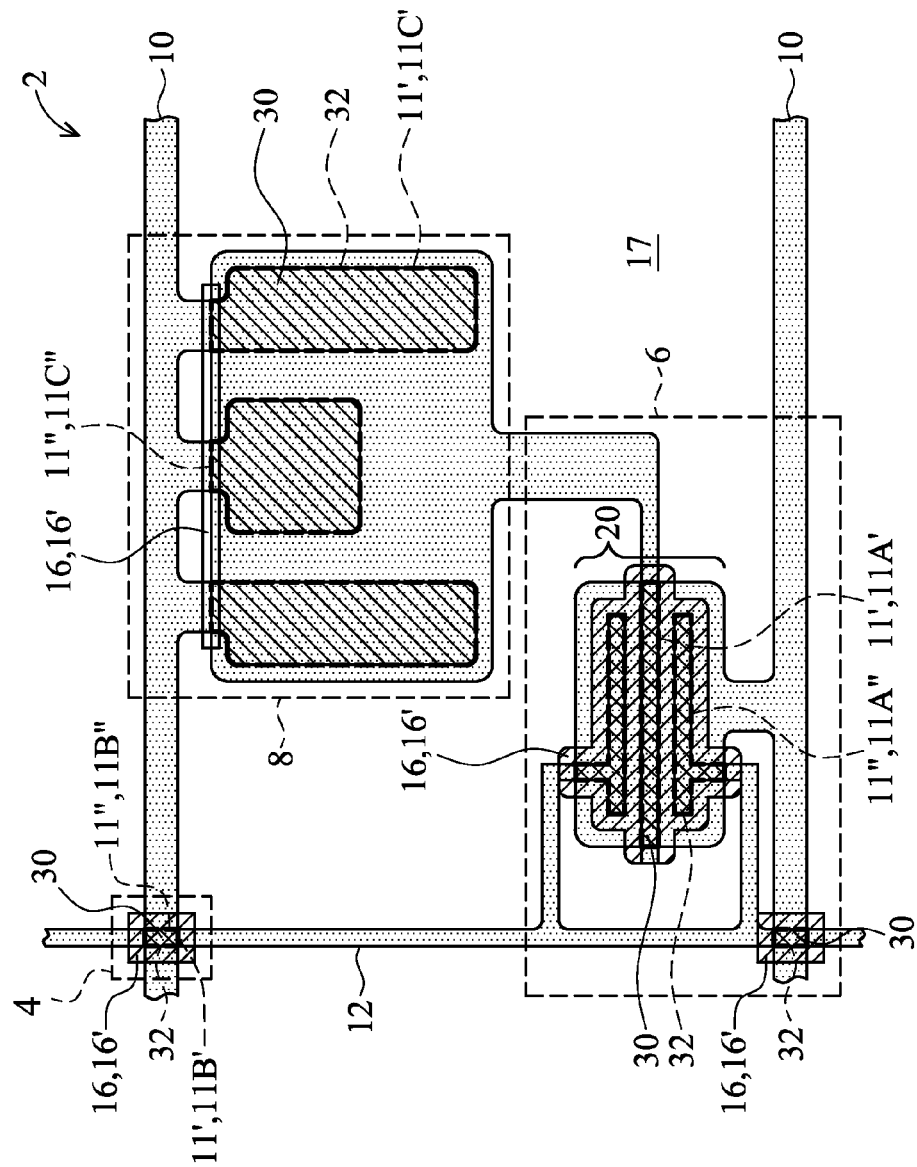
FIG. 2 shows an example of a pixel control structure in a second embodiment according to the invention.
Figure 3B:
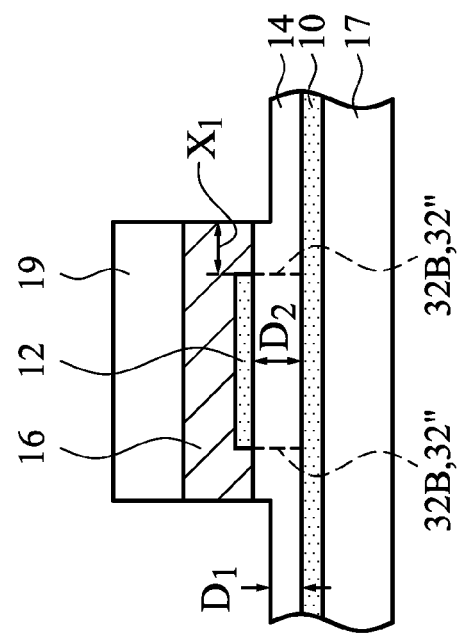
FIG. 3B shows a cross-section A-A' indicated in FIG. 3A.
Figure 3A:
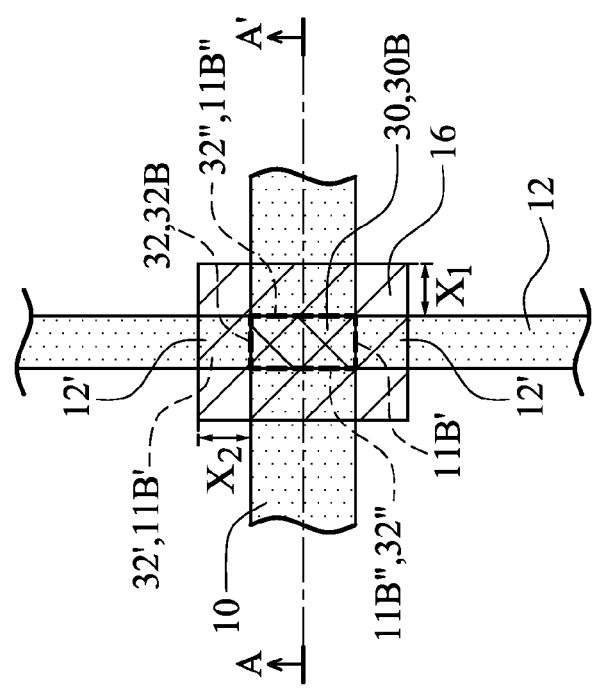
FIG. 3A shows a first detail of FIG. 2.
Figure 4:
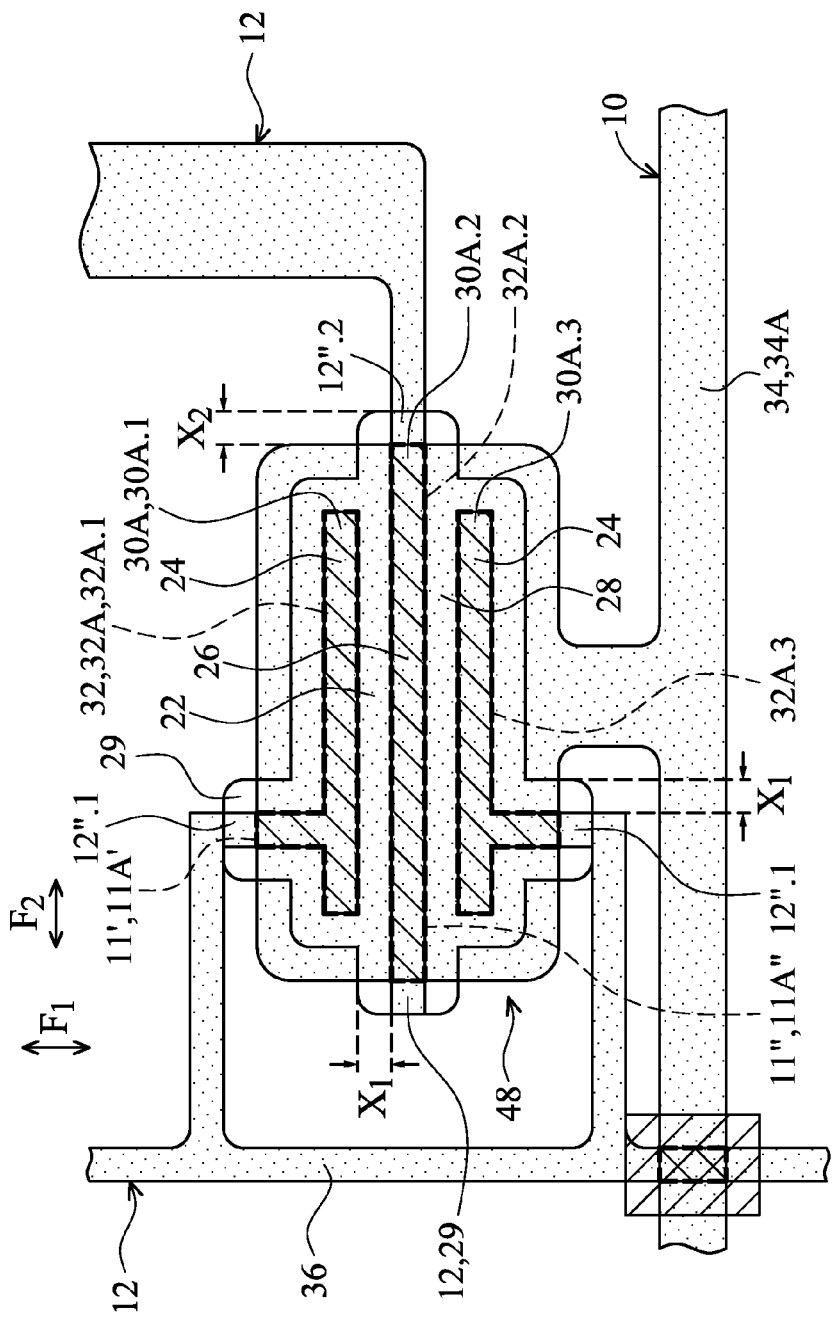
FIG. 4 shows a second detail of FIG. 2.
Figure 5:
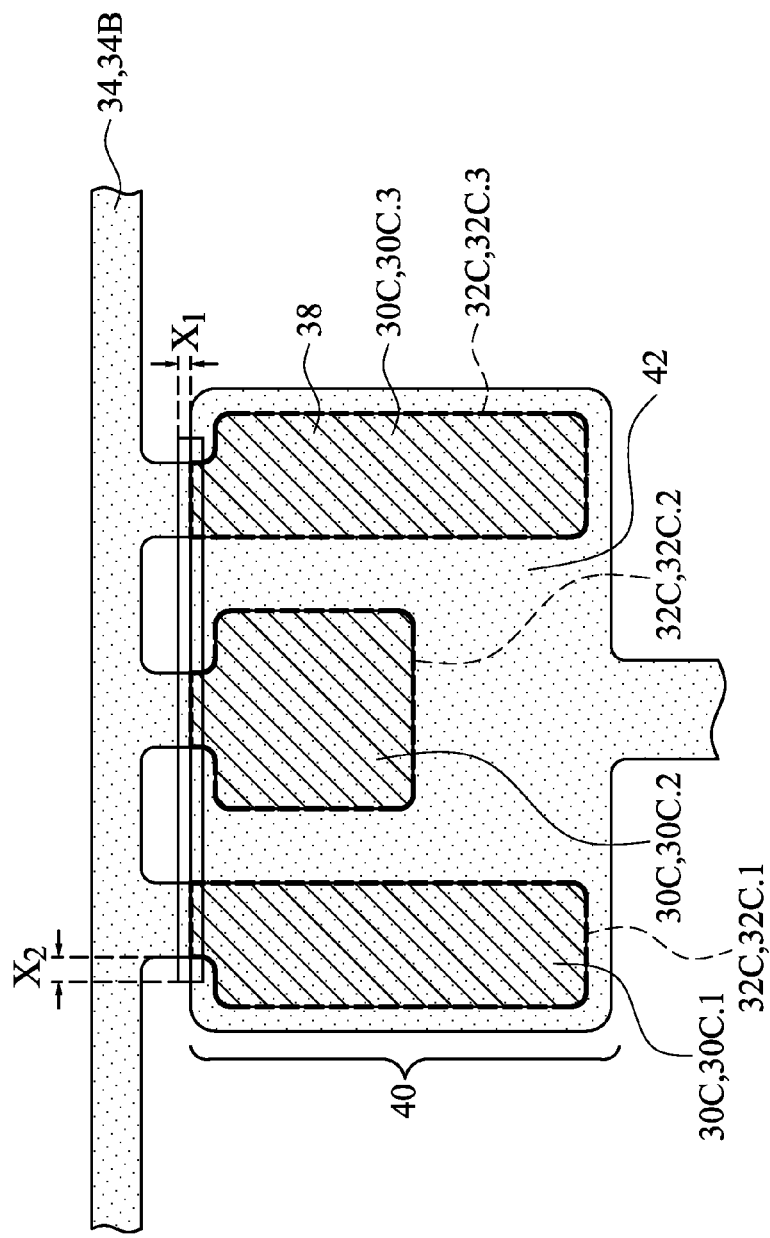
FIG. 5 shows a third detail of FIG. 2.

FIG. 2 shows an example of a pixel control structure 2 in a second embodiment according to the invention. The pixel control structure 2 in the second embodiment, and variations thereof, are further described with reference to FIGS. 3A-5. FIG. 3A shows a first detail 4 of FIG. 2 referenced as cross-over region. FIG. 3B shows a cross-section A-A' indicated in FIG. 3A. FIG. 4 shows a second detail 6 of FIG. 2 referenced as transistor region. FIG. 5 shows a third detail 8 of FIG. 2 referenced as storage capacitor region.

The pixel control structure 2 can be used in a backplane for an electronic display. The electronic display may e.g. be a flexible display. The electronic display may e.g. be an active-matrix display. The electronic display may e.g. comprise an electrophoretic front plane or an electrowetting front plane. By means of the pixel control structure 2, a pixel of the display may be controlled. A voltage that, in use, drives the pixel may be controlled by means of the pixel control structure 2, so that an optical appearance of the pixel can be controlled. The backplane may comprise a plurality of the pixel control structures 2. The pixel control structures 2 may be mutually electrically connected. Thus, the pixel control structures 2 may form an array that extends in two mutually transverse directions. Such an array is also referred to herein as a two-dimensional array of interconnected pixel control structures 2. One or both of said mutually transverse directions may extend along a curved path.

Application of the pixel control structure 2 in a backplane of a flexible electrophoretic display is considered especially advantageous. Layer stacks and materials that are suitable for a flexible electrophoretic display, may particularly benefit from the pixel control structure 2.

The pixel control structure 2 is formed by a first patterned conductive layer portion 10, a second patterned conductive layer portion 12, a dielectric layer portion (not drawn in FIGS. 2, 3A, 4-6 but visible in e.g. FIGS. 1 and 3B with reference number 14), and an organic patterned semiconductive layer portion 16. The patterned semiconductive layer portion 16 may be provided, at least partly, on top of the second patterned conductive layer portion 12. Said first patterned conductive layer portion 10, second patterned conductive layer portion 12, and organic patterned semiconductive layer portion 16 may be a portion of respectively a patterned first conductive layer, a patterned second conductive layer, and a patterned organic semiconductive layer. Said dielectric layer portion 14 may be a portion of a patterned dielectric layer or a non-patterned dielectric layer. I.e., the dielectric layer portion 14 may or may not be patterned. It is noted that, e.g. near edges of a two-dimensional matrix of pixel control structures 2, contact holes may be made in the dielectric layer 14 in order to make contacts to the first patterned conductive layer and the second patterned conductive layer. Said contact holes may be needed for electrically contacting said layers. The first patterned conductive layer, the second patterned conductive layer, the dielectric layer, and the patterned semiconductive layer may form additional pixel control structures 2. Said layers may form the plurality of pixel control structures 2. It may be clear that the first patterned conductive layer portion, the second patterned conductive layer portion, the dielectric layer portion, and the patterned semiconductive layer portion may extend in parallel with each other over a substrate 17. Said substrate 17 is visible in FIG. 3B. The stack of said layers may be deposited on said substrate 17.

The pixel control structure 2 may comprise a transistor 20 (a thin-film transistor 20) that has a gate 22, a source 24, a drain 26, and an organic semiconductor element 28. The organic semiconductor element 28 is electrically connected to the source 24 and the drain 26. The transistor 20 may be used for controlling the pixel of the display. The first patterned conductive layer portion 10 forms the gate 22, i.e. comprises the gate 22. The second patterned conductive layer portion 12 forms the source 24 and the drain 26, i.e. comprises the source 24 and the drain 26. The organic patterned semiconductive layer portion 16 forms the organic semiconductor element 28 of the transistor 20. i.e. comprises the organic semiconductor element 28 of the transistor 20.

The dielectric layer portion 14 separates the first and second patterned conductive layer portion 10, 12. The dielectric layer portion 14 may be provided in between the first patterned conductive layer portion 10 and the second patterned conductive layer portion 12. Hence, the dielectric layer portion 14 may at least partly overlap the first patterned conductive layer portion 10. The second patterned conductive layer portion 12 may at least partly overlap the dielectric layer portion 14.

More generally, the dielectric layer portion may comprise an overlap region 30 defined by overlap of the second patterned conductive layer portion 12 over the first patterned conductive layer portion 10. The overlap region 30 may define an overlap boundary 32 that bounds the overlap region 30. The first patterned conductive layer portion 10 and the second patterned conductive layer portion 12 respectively have a first edge portion 11' and a second edge portion 11". The overlap boundary may comprise a first boundary part where the overlap region is bounded along the first edge portion 11'. The overlap boundary may comprise a second boundary part where the overlap region is bounded along the second edge portion 11".

According to a first advantageous aspect of the second embodiment, the overlap region 30 may comprise a transistor region 30A. Then, the overlap region is, at least partly, formed by the transistor region 30A. The transistor region 30A overlaps at least part of the gate 22 and extends under at least part of the source 24 and the drain 26. The transistor region 30A is bounded by a transistor boundary 32A that forms at least part of the overlap boundary 32. In this example, the transistor region 30A comprises three mutually separated regions 30A.i (i=1, 2, or 3), each being bounded by a separated region boundary 32A.i (i=1, 2, or 3) being closed in itself. The transistor region is bounded along a first transistor edge portion 11A', being part of the first edge portion 11'. Furthermore, the transistor region is bounded along a second transistor edge portion 11A", being part of the second edge portion 11". In this example, the second transistor edge portion 11A" may extend in different directions. The transistor boundary may comprise a first transistor boundary part where the overlap region is bounded along the first edge portion. The overlap boundary may comprising a second transistor boundary part where the overlap region is bounded along the second edge portion.

According to a second advantageous aspect of the second embodiment, the overlap region 30 may comprise a cross-over region 30B. The first patterned conductive layer portion 10 may form a portion of a row line 34. The row line 34 may extend through a plurality of pixel control structures 2. The row line 34 may be a gate row line 34A. Alternatively, the row line 34 may be a storage capacitor row line 34B. The second patterned conductive layer portion 12 may form a portion of a source-drain column line 36. The source-drain column line 36 may extend through a plurality of pixel control structures 2 in a direction transverse, e.g. perpendicular, to the row line 34. As a result, in the pixel control structure 2, the source-drain column line portion 36 may cross over the row line portion 34. Where the source-drain column line portion crosses over the row line portion, the cross-over region 30B may be defined in the dielectric layer portion 14.

The cross-over region 30B may overlap the gate line portion and extend under the source-drain column line portion. The cross-over region 30B may be bounded by a cross-over boundary 32B that forms at least part of the overlap boundary 32. In this example, the cross-over region 30B may be a gate row line cross-over region 30B.1. Alternatively, the cross-over region 30B may be a storage capacitor row line cross-over region 30B.2. Thus, the overlap region may, at least partly, be formed by the cross-over region 30B. Then, the overlap region 30 may comprise the cross-over region 30B. The cross-over region 30B, e.g. the gate row line cross-over region 30B.1 or the storage capacitor row line cross-over region 30B.2, is an example of a separated region 30. The cross-over region 30B may be bounded by a cross-over boundary 32B that forms at least part of the overlap boundary 32. Thus, the overlap boundary 32B may comprise the cross-over boundary 32B. The cross-over boundary may e.g. be a gate row line cross-over region 32B.1 or a storage capacitor row line cross-over region 32B.2.

The cross-over region 30B is bounded along, here parallel with, a first cross-over edge portion 11B' that is part of the first edge portion 11'. The overlap region is further bounded along, here parallel with, a second cross-over edge portion 11B' that is part of the second edge portion 11". Thus, a cross-over boundary 32B of the cross-over region may extend along the first cross-over edge portion 11B' and along the second cross-over edge portion 11B". The patterned semiconductive layer portion 16 extends over the cross-over region 30B and away from the cross-over region 30B to cover, at least partly, the second cross-over edge portion 11B' and to extend over, at least partly, the first cross-over edge portion 11B".

According to a third advantageous aspect of the second embodiment, the overlap region 30 may comprise a capacitor region 30C. The pixel control structure 2 may comprise a storage capacitor 40. Such a storage capacitor may be beneficial for controlling the pixel. E.g., a kick-back voltage may be reduced or may even be substantially prevented. The first patterned conductive layer portion 10 may form a first electrode 38 of a storage capacitor 40. The second patterned conductive layer portion 1 may form a second electrode 42 of the storage capacitor 40. The second electrode 42 may, at least partly, overlap the first electrode 38. Where the second electrode overlaps the first electrode, the capacitor region 30C may be defined in the dielectric layer portion 14 that overlaps the first electrode 38 and extends under the second electrode 42.

Thus, the overlap region 30 may be, at least partly, formed by the capacitor region 30C. Then, the overlap region 30 may comprise the capacitor region 30C. The capacitor region 30C may be bounded by a capacitor boundary 32C that forms at least part of the overlap boundary 32. Thus, the overlap boundary 32 may comprise the capacitor boundary 32C. The capacitor region 30C is bounded along, here parallel with, a first capacitor edge portion 11C' that is part of the first edge portion 11'. The overlap region is further bounded along, here parallel with, a second capacitor edge portion 11C" that is part of the second edge portion 11". Thus, a capacitor boundary 32C of the capacitor region may extend along the first capacitor edge portion 11C' and along the second capacitor edge portion 11C". The patterned semiconductive layer portion 16 may extend over the capacitor region 30C and away from the capacitor region 30C to cover, at least partly, the second capacitor edge portion 11C" and to extend over, at least partly, the first capacitor edge portion 11C'.

In this example, the capacitor region 30C comprises three mutually separated regions 30C.1, 30C.2, 30C.3, each having a separated region boundary respectively 32C.1, 32C.2, 32C.3 closed in itself. It may thus be clear that the overlap region may comprise one or more mutually separated regions 30C.i that, in this example, each have a separated region boundary 32 closed in itself. The overlap boundary 32 that bounds the overlap region 30 may comprise the separated region boundaries 32C.i.

Thus, in the example according to the second embodiment of the pixel control structure as illustrated in FIGS. 2-5, the overlap region 30 comprises the transistor region 30A, the gate row line cross-over region 30B.1, the storage capacitor row line cross-over region 30B.2, and the capacitor region 30C. However, the invention is not limited to the embodiment of FIG. 2. For example, the storage capacitor and the storage capacitor row line may be lacking. Then, the overlap region 30 may comprise the transistor region 30A and the gate row line cross-over region 30B.1. Then, the overlap region may lack the storage capacitor row line cross-over region 30B.2 and the capacitor region 30C.

It may thus be clear that, more in general, the overlap region 30 may comprises a plurality of mutually separated regions 30 each having, preferably, a separated region boundary 32 closed in itself. The overlap boundary 32 that bounds the overlap region 30 may comprise the separated region boundaries 32. However, alternatively, the overlap region may comprise only one region 30 bounded by only one separated region boundary 32 being closed in itself. Conversely to said alternative, at least two of the transistor region 30A, the cross-over regions 30B.1, 30B.2, and the capacitor region 30C may form the mutually separated regions and at least two of the transistor boundary 32A, the cross-over boundaries 32B.1, 32B.2, and the capacitor boundary 32C form the separated region boundaries.

It may be appreciated that, as is e.g. visible in FIG. 2, the patterned semiconductive layer portion 16 may comprise one or more, e.g. a plurality, of semiconductor islands 16'. Each semiconductor island may extend over the overlap region and away from the overlap region to cover a part of the second edge portion and to cover a part of the first edge portion. A semiconductor island may e.g. extend over the transistor region and away from the transistor region to cover the second transistor edge portion 11A" and to cover the first transistor edge portion 11A'. Another semiconductor island may e.g. extend over the (gate row line) cross-over region and away from the (gate row line) cross-over region to cover the second (gate) cross-over edge portion 11B" and to cover the first (gate) cross-over edge portion 11B'. Another semiconductor island may thus extend over the (capacitor row line) cross-over region and away from the (capacitor row line) cross-over region to cover the second (capacitor) cross-over edge portion 11B" and to cover the first (capacitor) cross-over edge portion 11B'. A further semiconductor island may e.g. extend over the capacitor region and away from the capacitor region to cover the second capacitor edge portion 11C" and to cover the first capacitor edge portion 11C'.

A semiconductor island 16' may be separated from other semiconductor islands 16'. Thus, the semiconductor islands 16' may be free of mutual electrical contact through the patterned semiconductive layer portion 16. Hence, leakage current from one semiconductor island to another semiconductor island may be prevented. The patterned semiconductive layer portion 16 may extend over the overlap region. That is, the patterned semiconductive layer portion 16 may overlap the overlap region. In particular, a semiconductor island 16' may extend over, at least part of, the transistor region 30A. Another semiconductor island 16' may extend over, at least part of, the gate row line cross-over region. Yet another semiconductor island 16' may extend over, at least part of, the storage capacitor row line cross-over region. A further semiconductor island 16' may extend over, at least part of, the capacitor region. Optionally, the patterned semiconductive layer portion 16 extends over substantially the whole overlap region. However, this is not necessary, as shown e.g. in FIG. 5.

The patterned semiconductive layer portion 16 may be manufactured from a continuous semiconductive layer that is deposited by a blanket deposition technique, e.g. spin coating. Patterning may be carried out by means of lithography. Such lithography may comprise the step of covering the continuous semiconductive layer by a continuous resist layer, may comprise the step of illuminating the resist layer through a mask for selectively reacting the resist layer according to a desired pattern that is provided on the mask, may comprise the step of developing the resist for removing parts of the resist that have not reacted, thus obtaining a patterned resist layer, may comprise etching the semiconductive layer at positions that are not covered by the patterned resist layer, and/or may comprise removing the patterned resist layer. The pattern resist layer may comprise a plurality of patterned resist layer portions 19 (FIG. 3B). The etching preferably comprises dry etching or anisotropic etching. However, alternatively, the etching may comprise wet etching or isotropic etching.

To promote complete removal of semiconductive material at places where it should be removed, it is common to apply some over-etching. An over-etch time may be defined as a time from a moment the dielectric layer portion is first, partly, exposed to the etching, to a time at which the etching ends. The over-etch time may typically be 20%-50% of a total etch time, the total etch time being a time from a moment at which the etching starts to the time at which the etching ends. It is noted that, especially during over-etching, the patterned resist layer portion and the second patterned conductive layer portion 12, may function as an etch mask. Conversely, areas where the dielectric layer portion 14 is exposed to the etching, i.e. is not covered by the patterned resist layer portion 16 and/or the second patterned conductive layer portion 12, may be partly removed by the etching. As a result, a thickness $D_1$ of the dielectric layer at exposed areas of the dielectric layer may be smaller than a thickness $D_2$ of covered areas of the dielectric layer portion. $D_1$ and $D_2$ are indicated in FIG. 3B. Thus, the dielectric layer portion 14 may be deteriorated during etching leading to the thickness $D_1$ in the areas of the dielectric layer portion that are exposed to the etching.

When an isotropic etch method is used an under-etch is expected. Then, the dielectric layer portion 14 located under the patterned resist layer portion may be etched away over a length dependent on the total etch time. Such may also lead to deterioration of the dielectric layer portion 14. A thickness of the dielectric layer portion under the patterned resist layer portion may be reduced due to this under-etch.

The inventors realized that, as a result of overlap between the patterned semiconductive layer portion with the second edge portion and with the first edge portion, as described herein, a deteriorated part of the dielectric layer portion (as a result of isotropic or anisotropic etching) can be positioned further away from the overlap region. As a result, a probability for electrical breakdown may be reduced.

Lithographic patterning may be carried out for obtaining the patterned first conductive layer portion and the patterned second conductive layer portion, mutatis mutandis. Options to carry out such lithographic patterning are known as such to the skilled person so that a further description is deemed superfluous. Various materials can be used for manufacturing the first and second conductive layer portions. For example, the first and/or second conductive layer portion may comprise an inorganic conductive material, such as at least one metal, e.g. gold, silver, aluminum, and/or molybdenum. Alternatively, the first and/or second conductive layer portion may comprise an organic conductive material. Examples of such materials, and examples of methods of depositing and patterning such material, are known as such to the skilled person.

The dielectric layer portion may comprise an organic material. E.g., the dielectric layer may be formed from a spincoatable solution comprising a photopatternable organic resin and one or more solvents. After evaporation of the solvent, the patterned resist layer portion 19 may be obtained from a blanket of the organic resin by photolithography or by other patterning methods such as photopatterning, patterning using an extra, sacrificial, resist layer plus an etching step, or by selective deposition such as inkjet printing. Examples of such materials are known as such. Alternatively, the dielectric layer portion may comprise an inorganic material, such as silicon oxide or silicon nitride.

The organic semiconductive layer portion may comprise pentacene and/or another semiconductive organic material.

More generally, the overlap boundary 32 may comprise a first boundary part 32' that is covered by the second patterned conductive layer portion extending away from the overlap region 30. For example, FIG. 3A illustrates the first boundary part 32' as far as comprised by the cross-over boundary 32B. The first boundary part 32' visible in FIG. 3A is covered by parts 12' of the second patterned conductive layer portion that are contiguous to the overlap region, here the cross-over region. The first boundary part may, during an etching step of patterning for obtaining the patterned semiconductive layer portion 16, be substantially protected against the etchant by means of the second patterned conductive layer portion 12.

The overlap boundary 32 may further comprise a second boundary part 32", examples of which are illustrated in FIGS. 3A and 3B. The second boundary part 32" may be distinct from, preferably contiguous to, the first boundary part 32'. FIGS. 3A and 3B illustrate the second boundary part 32" as far as comprised by the cross-over boundary 32B. The second boundary part 32" in FIG. 3A is substantially uncovered by parts 12' of the second patterned conductive layer portion that are contiguous to the overlap region, here the cross-over region. The first boundary part 32' and the second boundary part 32" may together form substantially the whole overlap boundary 32.

The patterned semiconductive layer portion 16 may extend over the overlap region 30 and away from the overlap region 30 to cover, at least partly, the second boundary part 32". Thus, the second boundary part is, at least partly, protected against etching by means of the patterned resist layer portion 19. The second boundary part may lack protection from the parts 12' of the second patterned conductive layer portion that are contiguous to the overlap region. Such protection by the patterned resist layer portion 19 can be recognized in the pixel control structure 2 by overlap, e.g. coverage, of the at least part of the second boundary part by means of the patterned semiconductive layer portion.

Deterioration of the dielectric layer portion as a result of the etching (isotropic or anisotropic etching), could lead to an increased vulnerability for electrical breakdown as a result of an electrical field between the first conductive layer portion and the second conductive layer portion. E.g., a thinner dielectric layer portion 14 may form potential weak spots for dielectric breakdown, when a voltage difference is applied between the first and second conductive layer portions 10, 12. Not only a thinner dielectric layer portion but also damage (e.g. oxidation) or redeposition (of e.g. metal particles originating from the first and/or second patterned conductive layer portion 10, 12) during etching can further weaken the dielectric layer portion and enhance a probability for electrical breakdown of the dielectric layer portion. It is noted that weak spots caused by etching into the dielectric layer can persist after over-coating the whole stack with an additional dielectric layer portion. For example, the inventors observed in experiments with an organic dielectric layer, that dry etching creates paths with higher electrical leakage which are not eliminated by depositing the additional dielectric layer portion on top of the dielectric layer portion 14. Said vulnerability for electrical breakdown may be largest at or adjacent to the overlap boundary 32. However, as a result of the protection provided by the patterned resist layer portion, a probability for electrical break-down may be reduced. A reliability of the pixel control structure may be improved. E.g., a yield can be improved and/or an operational life-time can be improved. Such advantages may be achieved without additional processing steps. Hence, additional costs for achieving the reduced probability for electrical break-down may be substantially prevented. It may thus be appreciated that a mask for patterning the resist layer portion and the semiconductive layer portion may be designed to cover potentially weak spots in the dielectric layer portion 14 along the overlap boundary 32.

A dielectric layer portion comprising an organic material may be beneficial for flexibility of the pixel control structure 2. Also, a dielectric layer portion comprising an organic material may be more vulnerable to deterioration as a result of etching. Hence, the invention is especially useful when the dielectric layer portion comprises an organic material.

FIGS. 3A-5 indicate a first distance $X_1$ and a second distance $X_2$. said first and second distance being an in-plane interdistance between the overlap boundary 32 and one of the first and second edge portions 11', 11". In general, the first distance and the second distance may have mutually transverse, e.g. mutually perpendicular, directions. The first distance $X_1$ and the second distance $X_2$ may be used for indicating quantitative aspects that may, optionally, be applied in the invention. The patterned semiconductive layer portion may extend away from the overlap region over the first distance $X_1$ to cover, at least partly and preferably completely, the second boundary part and/or the second edge portion. The patterned semiconductive layer portion may extend away from the overlap region over the second distance $X_2$ to cover, at least partly and preferably completely, the first boundary part and/or the first edge portion. Preferably, the first distance is at least a positioning accuracy of the mask for patterning the patterned semiconductive layer portion, e.g. is at least 5 micrometer. Preferably, the first distance is at most 20 micrometer, at most 50 micrometers, or at most 100 micrometers. Then, a good coverage and thus a good protection of the second boundary part can be obtained. Preferably, the second distance is at least a positioning accuracy of the mask for patterning the patterned semiconductive layer portion, e.g. is at least 5 micrometer. Preferably, the second distance is at most 20 micrometer, at most 50 micrometers, or at most 100 micrometers.

Thus, more in general, overlap of the patterned semiconductive layer portion 16 with the second patterned conductive layer portion 12 outside the overlap region may be provided, over the distance $X_2$. Said overlap $X_2$ preferably is large enough to compensate for misalignment of the mask for patterning the patterned semiconductive layer portion. Preferably, overlay of the patterned semiconductive layer portion 16 with the first patterned conductive layer portion 12 outside the overlap region is provided, over overlay distance X. Said overlay distance $X_1$ preferably is large enough for preventing deterioration of the dielectric layer portion as a result of etching that may, in use, lead to electrical breakdown through the dielectric layer portion as a result of a voltage difference between the first conductive layer portion 10 and the second conductive layer portion 12. The overlay $X_1$ and the overlay $X_2$ may depend on specifications of equipment used for lithography, etching, and other processes for patterning the semiconductive layer portion 16.

Figure 6:
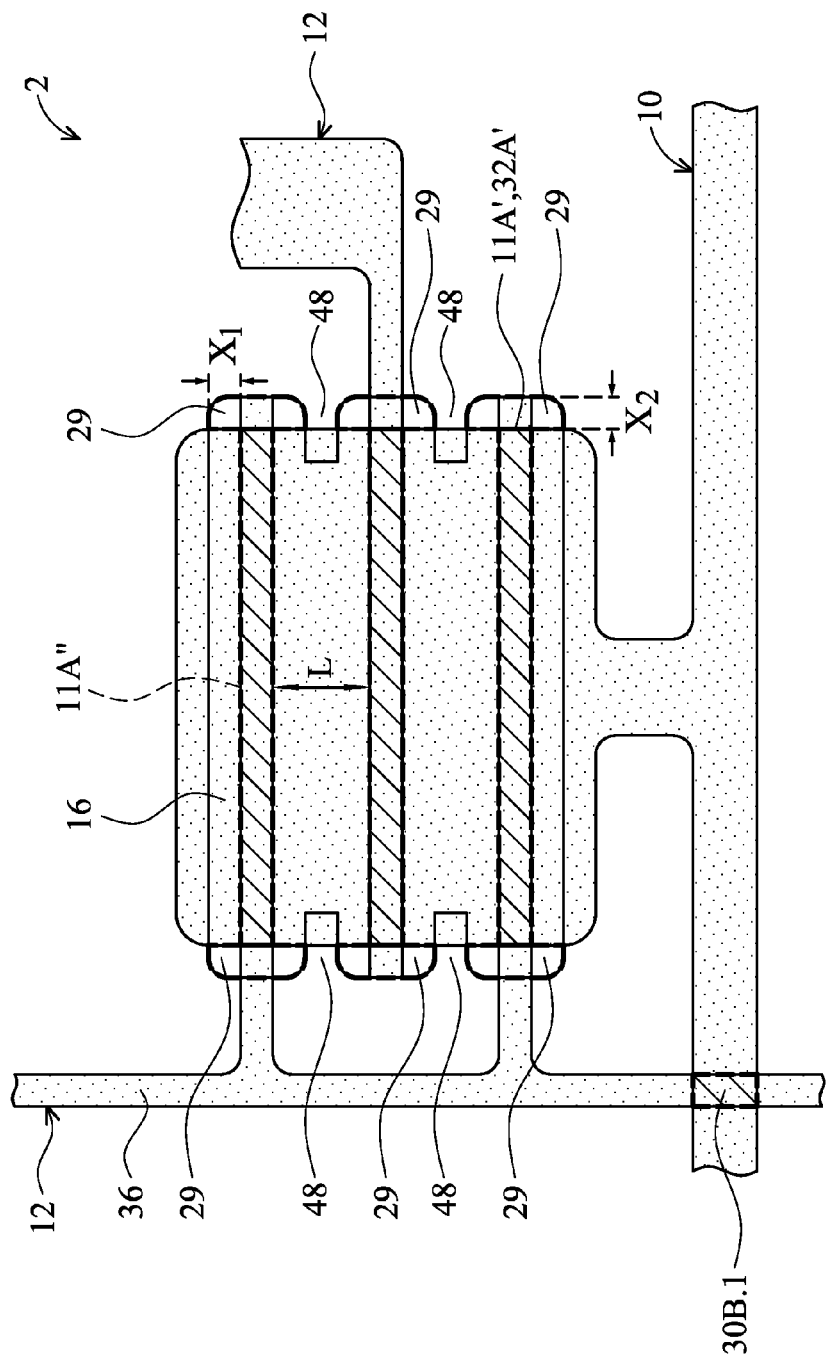
FIG. 6 shows a detail of a pixel control structure in a third embodiment according to the invention.

FIG. 6 shows a detail of a pixel control structure 2 in a third embodiment according to the invention. Except for the detail shown in FIG. 6, which may be regarded as an alternative for the detail 6 shown in FIG. 2, the pixel control structure 2 in the third embodiment may be similar to the pixel control structure 2 in the second embodiment. Although not shown in FIG. 6, in the pixel control structure 2 in the third embodiment, the patterned semiconductive layer portion 16 may extend over the gate row line cross-over region 30B.1 and away from the gate row line cross-over region 30B.1 to cover, at least partly, the second boundary part as far as comprised by the gate row line cross-over boundary 32B.1, and to extend over, at least partly, the first boundary part as far as comprised by the gate row line cross-over boundary 32B.1.

The pixel control structure 2 in the third embodiment comprises the first patterned conductive layer portion 10 and, the second patterned conductive layer portion 12. In between the first and second patterned conductive layer portions 10, 12, i.e. over the first patterned conductive layer portion 10 and under the second patterned conductive layer portion 12, a dielectric layer portion 14 may be provided. On top of the second patterned conductive layer portion 12, the patterned semiconductive layer portion 16 may be provided.

In FIG. 6, the patterned semiconductive layer portion 16 extends outwards and away from the overlap region 30 to substantially extend over, at least partly, the first transistor edge portion 11A' and/or the first transistor boundary part 32A'. By such extending away from the overlap region 30, a first overlay part 29 of the patterned semiconductive layer portion 16 may be formed that is, in use, substantially free of electrical control by the first patterned conductive layer portion 10. In the first and third embodiment, a further overlay part 29 of the patterned semiconductive layer portion may be provided that is, in use, also substantially free of electrical control by the first patterned conductive layer portion 10. Between said first overlay part 29 and further overlay parts 29 that are not controlled by the first conductive layer 10 a direct electrical path is lacking in the patterned semiconductive layer portion 16 that is not controlled by first conductive layer portion 10. Thus, in order to avoid a leakage current between the source 24 and the drain 26, semiconductor layer portions 16 extend inwards away from the edge of the first conductive layer portion 10 to form gaps 48 between overlay parts 29 of the patterned semiconductive layer portion that are in use, substantially free of electrical control by the first patterned conductive layer portion 10. The gap 48 ensures electrical control in the semiconductor layer portions 16 that are in use, substantially free of electrical control by the first patterned conductive layer portion 10. Accordingly, any electrical pathways in the semiconductor layer portion 16 between distinct overlay parts 29 that are not electrically controlled by conductive portion 10, are all electrically controlled by conductive portion 10.

More generally, illustrated by example in FIG. 4, a part 12" of the second patterned conductive layer portion that is contiguous to the transistor region 30A may comprise a first part 12".1 that is directly connected to the source 24 and a second part 12".2 that is directly connected to the drain 26. FIG. 4 shows the first part 12".1 of the second patterned conductive layer portion 12 that is directly connected to the source 24 and the second a part 12".2 of the second patterned conductive layer portion 12 that is directly connected to the drain 26. The first part 12".1 and the second part 12".2 may be spaced apart along the transistor boundary 32A. In particular, the first part 12".1 and the second part 12".2 are spaced apart over a distance along the transistor boundary 32A that is larger than 25 micrometer, preferably larger than 50 micrometer, more preferably larger than 75 micrometer, preferably smaller than 150 micrometer. By being spaced apart in such a way, space is provided between the first part 12".1 and the second part 12".2 for providing the gap 48.

Preferably, an angle between a first direction $F_1$ along which the first part 12".1 extends away from the transistor region 30A, and an angle $F_2$ along which a second part 12".2 extends away from the transistor region 30A, may be larger than 30 degrees, preferably larger than 60 degrees, more preferably approximately 90 degrees. By way of example, the directions $F_1$ and $F_2$ are indicated in FIG. 4. Such an angle may create space for the gap 48 and/or it may create alignment tolerance. The kickback of the pixel strongly depends on drain-gate capacitance. The design shown in FIG. 4 is relatively insensitive to small misalignment between the first conductive layer portion and the second conductive layer portion, as long as design rules of equipment and processes used for providing the first and second conductive layer portions are taken into account.

Figure 7:
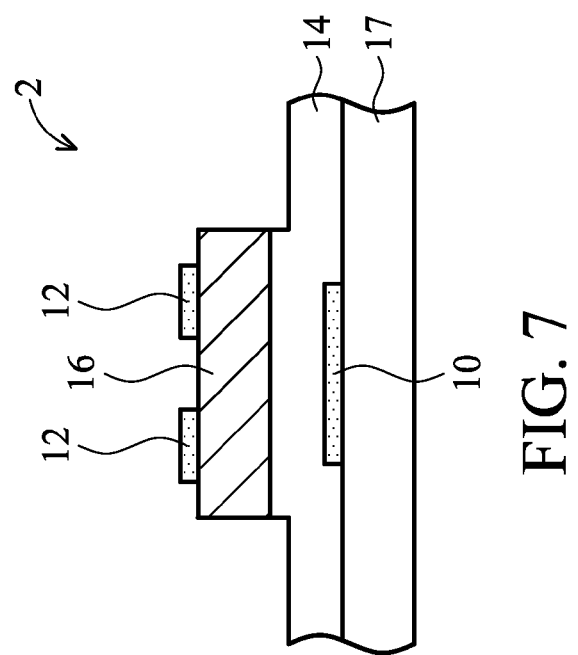
FIG. 7 shows a cross-section of a fourth embodiment of a pixel control structure according to the invention.

FIG. 7 shows a cross-section of a fourth embodiment of a pixel control structure according to the invention. FIG. 7 shows the substrate 17, the first patterned conductive layer portion 10, the second patterned conductive layer portion 12, the dielectric layer portion 14, and the organic patterned semiconductive layer portion.

In the embodiment of FIG. 3B, wherein patterned semiconductive layer portion 16 is provided, at least partly, on top of the second conductive layer portion. Conversely, in the embodiment of FIG. 7, the second conductive layer portion is provided, at least partly, on top of the patterned semiconductive layer portion 16. Thus, the patterned semiconductive layer portion may be provided directly below the second conductive layer portion. Further, the embodiment of FIG. 7 may be analogous to the embodiment of FIG. 3B.

Further, there is provided an embodiment of a method according to the invention of manufacturing a pixel control structure 2 in a backplane, further referred to as the preferred method. The pixel control structure 2 comprises the transistor 20 that has the gate 22, the source 24, the drain 26, and the organic semiconductor element 28 that is electrically connected to the source 24 and the drain 26. The pixel control structure 2 may be the pixel control structure 2 in the second embodiment, the third embodiment, or another pixel control structure 2.

The preferred method comprises forming the pixel control structure 2 by providing the first patterned conductive layer portion 10 that comprises the gate 22, the second patterned conductive layer portion 12 that comprises the source 24 and the drain 26, the dielectric layer portion for separating the first and second patterned conductive layer portion 10, 12, and the organic patterned semiconductive layer portion 16 that comprises the organic semiconductor element 28 of the transistor 20. The patterned semiconductive layer portion 16 may be provided on top of the second patterned conductive layer portion 12. In that way, electrical contact between the source 24 and the drain 26, via the patterned semiconductive layer portion 16, may be enabled.

Providing the second patterned conductive layer portion may comprise patterning a first continuous conductive layer portion, e.g. obtained by a blanket deposition process. Providing the patterned second conductive layer portion may comprise patterning a second continuous conductive layer portion, e.g. obtained by e blanket deposition process. Providing the patterned semiconductive layer portion may comprise patterning a continuous semiconductive layer portion, e.g. obtained by a blanket deposition process such as spin-coating. Said patterning steps can e.g. be carried out by means of photolithography.

After providing the first and second patterned conductive layer portions 10, 12, the dielectric layer portion 14 comprises the overlap region 30 defined by overlap of the second patterned conductive layer portion 12 over the first patterned conductive layer portion 10. The overlap region defines the overlap boundary 32 that bounds the overlap region 30. The first patterned conductive layer portion and the second patterned conductive layer portion respectively have a first edge portion and a second edge portion. The overlap region is bounded along the first edge portion and is bounded along the second edge portion.

In the preferred method, the second patterned conductive layer portion is provided for overlapping the first edge portion 11' by extending over the overlap region 30 and away from the overlap region 30. In addition, the patterned semiconductive layer portion is provided for overlapping, at least partly, the second edge portion by extending over the overlap region and away from the overlap region 30. Furthermore, the patterned semiconductive layer portion 16 is provided for overlapping, at least partly, the first edge portion by extending over the overlap region and away from the overlap region.

In the preferred method, overlapped, e.g. covered, parts of the overlap boundary 32 may not have been exposed to etching. Thus, deterioration of the covered parts of the overlap boundary 32 as a result of the etching, may be substantially prevented. This proved advantageous for reliability of a two-dimensional array of manufactured pixel control structures 2. Near the overlap boundary 32, an electric field strength between the first patterned conductive layer portion 10 and the second patterned conductive layer portion 12 may, in use, be intensified in case the dielectric layer portion 14 is deteriorated near the overlap boundary 32. Such intensification may lead to electrical breakdown through the deteriorated dielectric layer portion 14. The preferred method may be use for manufacturing the pixel control structure 2 in the second embodiment, the third embodiment, and in another embodiment.

According to an aspect of a pixel control structure 2 according to the invention, e.g. illustrated by means of the examples thereof in FIGS. 1-7, substantially the whole second boundary part 32" and/or second edge portion may be overlapped, e.g. covered, by the patterned semiconductive layer portion 16. Hence, during etching, substantially the whole second boundary part 32" may be protected by the patterned resist layer portion 19. According to another aspect, substantially the whole second boundary part 32" as far as comprised by the transistor boundary 32A, comprised by the cross-over boundary 32B, e.g. the gate row line cross-over region 32B.1 and/or the capacitor row line cross-over region 32B.2, and/or comprised by the capacitor region, may be covered by the patterned semiconductive layer portion 16. In an embodiment, substantially the whole second boundary part 32" as far as comprised by the at least one, or both, of the transistor boundary 32A and the gate row line cross-over boundary 32B.1 may be covered by the patterned semiconductive layer portion. In the transistor region 30A and the gate row line cross-over region 30B.1, in use of the pixel control structure 2, voltage variations may be relatively large. In the transistor region 30A and the gate row line cross-over region 30B.1, a voltage over the dielectric layer portion may, in use, be as large as approximately 30 volts, in particular when controlling an electrophoretic front plane. In the capacitor region 30C and in the capacitor row line cross-over region 30B.2, a voltage over the dielectric layer portion may, in use, be as large as approximately 15 volts, in particular when controlling an electrophoretic front plane.

According to another aspect of the invention, illustrated by means of the examples thereof in FIGS. 1-7, the patterned semiconductive layer portion extends over the overlap region and away from the overlap region so as to extend from both first and second edge portions. Hence, the patterned semiconductive layer portion 16 may extend over the overlap region 30 and away from the overlap region 30 to cover the second edge portion and to cover the first edge portion. Practical experience of the inventors has shown that overlapping the first edge portion is desirable. It may in practice enable covering the whole second edge portion in a reliable way. By means of a patterned resist layer portion 19, the first edge portion may be overlapped with the patterned semiconductive layer portion during an etching step of a patterning process for obtaining the patterned semiconductive layer portion 16. In that way it may be prevented that misalignment of the mask, used during said patterning process, with respect to the first- and/or second patterned conductive layer portion leads to part of the second edge portion' remaining uncovered. Thus, a reliability of pixel control structures 2, and hence of backplanes and displays, may be improved. By covering the first edge portion by means of the patterned semiconductive layer portion extending over and away from the overlap region, a reliable coverage of the second edge portion is enabled. Hence, additional overlap, i.e. by the patterned semiconductive layer portion 16, of the first edge portion offers a surprising advantage in that in enables complete overlap with the second boundary part 32".

Also, surprisingly, by extending away from the overlap region 30 to cover the first edge portion', an overlay part 29 of the patterned semiconductive layer portion 16 may, in use, be substantially free of electrical control by the first patterned conductive layer portion 10. Providing the non-controllable overlay part 29 of the patterned semiconductive layer portion 16 goes against a prejudice that the patterned semiconductive layer portion 16 must be well-controlled during operation of a display.

As described above, an improved design for the semiconductive layer portion 16 is provided in order to reduce electrical breakdown at or adjacent to the overlap boundary, in particular at or adjacent to the further part 32" of the overlap boundary. This is achieved by reducing a probability for causing potential weak regions in the dielectric layer at or near the second boundary part during etching of the semiconductive layer portion 16 between the first and second conductive layer portions. This can result in higher yield and extended operational lifetime. The electrical breakdown can occur during testing of the pixel control structure 2. In this case, breakdown may result in a reduced yield. The breakdown can, alternatively, occur during operation of the pixel control structure during use by a user.

The invention is not limited to any embodiment herein described. E.g., in the example of FIGS. 2-5, the overlap region 30 comprises the transistor region 30A, the gate row line cross-over region 30B.1, the capacitor row line cross-over region 30B.2, and the capacitor region 30C. However, the invention is not limited to the embodiment of FIGS. 2-5. For example, the overlap region may only comprise the transistor region 30A and/or the gate row line cross-over region 30B.1. Within the purview of the skilled person, modifications are possible which may be considered within the scope of the appended claims. Equally all kinematic inversions are considered inherently disclosed and to be within the scope of the present invention. It is further noted that terms like 'under' and 'over', e.g. as used in the term 'overlap', 'extends under', and 'extends over', are used in the normal sense corresponding with a situation wherein the substrate 17, on which the pixel control structure 2 may be provided, is facing downwards along the direction of gravitational attraction and the pixel control structure 2 is facing upwards. The indefinite article "a" or "an" does not exclude a plurality. Features which are not specifically or explicitly described or claimed may be additionally included in the structure according to the present invention without deviating from its scope.

What is claimed is:

1. A pixel control structure for use in a backplane for an electronic display comprising:
   a transistor that has a gate;
   a source;
   a drain; and
   an organic semiconductor element that is electrically connected to the source and the drain;
   wherein the pixel control structure is formed by a first patterned conductive layer portion that comprises the gate, a second patterned conductive layer portion that comprises the source and the drain, a dielectric layer portion separating the first and second conductive layer portion, and an organic patterned semiconductive layer portion that comprises the semiconductor element of the transistor; and
   wherein the first patterned conductive layer portion and the second patterned conductive layer portion respectively have a first edge portion and a second edge portion, said first and second edge portions determining an overlap region wherein the second patterned conductive layer portion overlaps the first patterned conductive layer portion, and the overlap region is bounded along the first and second edge portions, wherein the patterned semiconductive layer portion extends over the overlap region and away from the overlap region so as to extend over both first and second edge portions to thereby shield the dielectric layer from the second edge portion.

2. The pixel control structure according to claim 1, wherein the patterned semiconductive layer portion has, by extending away from the overlap region to extend over, at least partly, the first edge portion, a first overlay part of the patterned semiconductive layer portion that is, in use, substantially free of electrical control by the first patterned conductive layer portion.

3. The pixel control structure according to claim 2, wherein the patterned semiconductive layer portion has a further overlay part that is, in use, substantially free of electrical control; and said first and further overlay parts lack a direct electrical path connection.

4. The pixel control structure according to claim 2, wherein the patterned semiconductive layer portion has a further overlay part of the patterned semiconductive layer portion that is, in use, substantially free of electrical control by the first patterned conductive layer portion, wherein said first and further overlay parts are connected via patterned semiconductor layer portions extending inwards away from the first edge of the first conductive layer portion to have any electrical pathway between the first overlay part and further overlay part of the patterned semiconductor layer electrically controlled by first conductive layer portion.

5. The pixel control structure according to claim 1, wherein substantially all of the overlap region is bounded along the first edge portion or along the second edge portion.

6. The pixel control structure according to claim 1, wherein the patterned semiconductive layer portion extends over the overlap region and away from the overlap region so as to extend from substantially all of the first and second edge portions.

7. The pixel control structure according to claim 1, wherein the patterned semiconductive layer portion extends over substantially the whole overlap region.

8. The pixel control structure according to claim 1, wherein the patterned semiconductive layer portion extends away from the overlap region over a first distance to cover, at least partly, the second edge portion and extends away from the overlap region over a second distance to extend over, at least partly, the first edge portion, said first and second distance being measured in a direction perpendicular to the first edge portion or the second edge portion.

9. The pixel control structure according to claim 8, wherein the first distance is at least 5 micrometers and/or at most 100 micrometers, and/or wherein the second distance is at least 5 micrometers and/or at most 100 micrometers.

10. The pixel control structure according to claim 1, wherein the overlap region is, at least partly, formed by a transistor region that overlaps at least part of the gate and extends at least partly under the source and the drain, the transistor region being bounded along a first transistor edge portion that forms at least part of the first edge portion, and being bounded along a second transistor edge portion that forms at least part of the second edge portion, wherein the patterned semiconductive layer portion extends over the transistor region and away from the transistor region so as to extend over both first and second transistor edge portions to thereby shield the second edge portion, wherein the patterned semiconductive layer portion extends over the transistor region and away from the transistor region to cover, at least partly, the second transistor edge portion and to extend over, at least partly, the first transistor edge portion.

11. The pixel control structure according to claim 10, wherein a part of the second patterned conductive layer portion that is contiguous to the transistor region comprises a first part that is directly connected to the source and a second part that is directly connected to the drain, wherein the first part and the second part are spaced apart along the first transistor edge portion and/or along the second transistor edge portion, in particular over a distance along the transistor boundary that is larger than 25 micrometer, preferably larger than 50 micrometer, more preferably larger than 75 micrometer.

12. The pixel control structure according to claim 1, wherein the first patterned conductive layer portion forms a portion of a row line that extends through a plurality of pixel control structures, and wherein the second patterned conductive layer portion forms a portion of a source-drain column line that extends through a plurality of pixel control structures in a direction transverse to the row line so that, in the pixel control structure, the source-drain column line portion crosses over the row line portion, wherein the overlap region is, at least partly, formed by a cross-over region that overlaps the gate line portion and extends under the source-drain column line portion where the source-drain column line portion crosses over the row line portion, the cross-over region being bounded along a first cross-over edge portion that forms at least part of the first edge portion, and being bounded along a second cross-over edge portion that forms at least part of the second edge portion, wherein the patterned semiconductive layer portion extends over the cross-over region and away from the cross-over region so as to extend over both first and second cross-over edge portions to thereby shield the dielectric layer from the second edge portion.

13. The pixel control structure according to claim 12, wherein the row line is a gate row line or a storage capacitor row line.

14. The pixel control structure according to claim 1, comprising a storage capacitor, wherein the first patterned conductive layer portion forms a first electrode of the storage capacitor, and wherein the second patterned conductive layer portion forms a second electrode of the storage capacitor that, at least partly, overlaps the first electrode, wherein the overlap region is, at least partly, formed by a capacitor region that overlaps the first electrode and extends under the second electrode where the second electrode overlaps the first electrode, the capacitor region being bounded along a first capacitor edge portion that forms at least part of the first edge portion, and being bounded along a second capacitor edge portion that forms at least part of the second edge portion, wherein the patterned semiconductive layer portion extends over the capacitor region and away from the capacitor region so as to extend over both first and second capacitor edge portions to thereby shield the second edge portion.

15. The pixel control structure according to claim 1, wherein the overlap region comprises a plurality of mutually separated regions that are overlapped at least partly by the semiconductive layer portion.

16. The pixel control structure according to claim 1, wherein the patterned semiconductive layer portion comprises a plurality of semiconductor islands that extend over the overlap region and away from the overlap region to cover, at least partly, the second edge portion and to extend over, at least partly, the first edge portion.

17. The pixel control structure according to claim 1, wherein, on top of the patterned semiconductive layer portion, a patterned resist layer portion is provided for protecting the patterned semiconductive layer portion during an etching step.

18. An array of the pixel control structures according to claim 1, which array extends in two mutually transverse directions.

19. A backplane for an electronic display comprising the array of claim 18.

20. An electronic display provided with the backplane of claim 19.

21. A method of manufacturing a pixel control structure in a backplane, the pixel control structure comprising a transistor that has a gate, a source, a drain, and an organic semiconductor element that is electrically connected to the source and the drain, the method comprising:
    forming the pixel control structure by providing a first patterned conductive layer portion that comprises the gate, a second patterned conductive layer portion that comprises the source and the drain, a dielectric layer portion for separating the first and second patterned conductive layer portion, and an organic patterned semiconductive layer portion that comprises the semiconductor element of the transistor, wherein the first patterned conductive layer portion and the second patterned conductive layer portion respectively have a first edge portion and a second edge portion, said first and second edge portions determining an overlap region wherein the second patterned conductive layer portion overlaps the first patterned conductive layer portion, and the overlap region is bounded along the first edge and second edge portions, wherein the patterned semiconductive layer portion extends over the overlap region and away from the overlap region, so as to extend over both first and second edge portions to thereby shield the dielectric layer from second edge portion.

22. The method according to claim 21, wherein providing the organic patterned semiconductive layer portion comprises providing, on top of the patterned semiconductive layer portion, a patterned resist layer portion for protecting the patterned semiconductive layer portion during an etching step.

* * * * *